(12) United States Patent
Schenone et al.

(10) Patent No.: US 7,818,654 B2
(45) Date of Patent: Oct. 19, 2010

(54) ADDRESSING STRATEGY FOR VITERBI METRIC COMPUTATION

(75) Inventors: Christine Schenone, Antibes (FR); Layachi Daineche, Le Cannet (FR); Aritz Sanchez Lekue, Bilbao (ES)

(73) Assignee: ST-Ericsson SA, Geneva (CH)

( * ) Notice: Subject to any disclaimer, the term of this patent is extended or adjusted under 35 U.S.C. 154(b) by 969 days.

(21) Appl. No.: 11/630,653

(22) PCT Filed: Jun. 20, 2005

(86) PCT No.: PCT/IB2005/052019
§ 371 (c)(1),
(2), (4) Date: Dec. 22, 2006

(87) PCT Pub. No.: WO2006/000982
PCT Pub. Date: Jan. 5, 2006

(65) Prior Publication Data
US 2008/0192865 A1 Aug. 14, 2008

(30) Foreign Application Priority Data
Jun. 23, 2004 (EP) ................................. 04300395

(51) Int. Cl.
*H03M 13/03* (2006.01)
(52) U.S. Cl. ........................ 714/795; 714/792; 714/794; 714/796; 375/272; 375/341
(58) Field of Classification Search .................. 714/792, 714/794–796; 375/262, 341
See application file for complete search history.

(56) References Cited

U.S. PATENT DOCUMENTS

| | | | | |
|---|---|---|---|---|
| 6,690,750 | B1 * | 2/2004 | Hocevar et al. | 375/341 |
| 6,865,710 | B2 * | 3/2005 | Bickerstaff et al. | 714/796 |
| 7,043,682 | B1 * | 5/2006 | Ferguson | 714/796 |
| 7,242,723 | B2 * | 7/2007 | Nieminen | 375/265 |
| 7,278,088 | B2 * | 10/2007 | Tsai et al. | 714/795 |

(Continued)

OTHER PUBLICATIONS

Ming-Der Shieh et al: "Efficient management of in-place path metric update and its implementation for Viterbi decoders" Circuits and Systems, 1998. ISCAS '98. Proceedings of the 1998 IEEE International Symposium on Monterey, CA, USA May 31-Jun. 3, 1998, New York, NY, USA,IEEE, US, vol. 4, May 3, 1998, pp. 449-452, XP010289495 ISBN: 0-7803-4455-3.

(Continued)

*Primary Examiner*—Esaw T Abraham
(74) *Attorney, Agent, or Firm*—William J. Kubida; Scott J. Hawranek; Hogan Lovells US LLP

(57) ABSTRACT

There is provided an addressing architecture for parallel processing of recursive data. A basic idea is to store a calculated new path metric at the memory location used by the old path metric, which old metric was employed to calculate the new metric. If m metric values are read and m metric values are simultaneously calculated in parallel, it is possible to store the new, calculated metrics in the memory position where the old metrics were held. This is advantageous, since the size of the storage area for the path metrics is reduced to half compared to the storage area employed in prior art Viterbi decoders for the same performance with regard to path metric computations.

11 Claims, 5 Drawing Sheets

U.S. PATENT DOCUMENTS

| | | | |
|---|---|---|---|
| 7,293,225 B2 * | 11/2007 | Sipila | 714/795 |
| 7,325,184 B2 * | 1/2008 | Yamanaka et al. | 714/795 |
| 7,346,836 B2 * | 3/2008 | Ozdemir | 714/795 |
| 7,398,458 B2 * | 7/2008 | Ferguson | 714/796 |
| 7,496,159 B2 * | 2/2009 | Wu et al. | 375/341 |

OTHER PUBLICATIONS

Min B K et al: "A versatile architecture for VLSI implementation of the Viterbi algorithm" Speech Processing 2, VLSI, Underwater Signal Processing. Toronto, May 14-17, 1991, International Conference on Acoustics, Speech & Signal Processing. ICASSP, New York, IEEE, US, vol. vol. 2 Conf. 16, Apr. 14, 1991, pp. 1101-1104, XP010043187 ISBN: 0-7803-0003-3.

Chien-Ming Wu et al: "VLSI architecture of extended in-place path metric update for viterbi decoders" ISCAS 2001. Proceedings of the 2001 IEEE International Symposium on Circuits and Systems. Sydney, Australia, May 6-9, 2001, IEEE International Symposium on Circuits and Systems, New York, NY : IEEE, US, vol. vol. 1 of 5, May 6, 2001, pp. 206-209, XP010541829 ISBN: 0-7803-6685-9.

Rader C M: "Memory Management in a Viterbi Decoder" IEEE Transactions on Communications, IEEE Inc. New York, US, vol. COM-29, No. 9, Sep. 1981, pp. 1399-1401, XP000877057 ISSN: 0090-6778.

Chang Y-N: "An Efficient In-Place VLSI Architecture for Viterbi Algorithm" Journal of VLSI Signal Processing Systems for Signal, Image, and Video Technology, Kluwer Academic Publishers, Dordrecht, NL, vol. 33, No. 3, Mar. 2003, pp. 317-324, XP001159409 ISSN: 0922-5773.

Mohammed Benaissa, Yiqun Zhu: "A Novel High-Speed Configurable Viterbi Decoder for Broadband Access" Internet Article, [Online] Dec. 2003, XP002337526 Retrieved from the Internet: URL:www.hindawi.net/access/get.aspx?journal=asp& volume=2003&pii=S1110865703310054> [retrieved on Jul. 22, 2005].

Kang I et al: "A Low-Power State-Sequential Viterbi Decoder for CDMA Digital Cellular Applications" 1996 IEEE International Symposium on Circuits and Systems (ISCAS). Circuits and Systems Connecting the World. Atlanta, May 12-15, 1996, IEEE International Symposium on Circuits and Systems (ISCAS), New York, IEEE, US, vol. vol. 4, May 12, 1996, pp. 272-275, XP000704589 ISBN: 0-7803-3074-9.

International Search Report, PCT/IB2005/052019, mailing date Jan. 18, 2006, pp. 4.

Notification of Transmittal of the International Search Report and the Written Opinion of the International Searching Authority, or the Declaration, PCT/IB2005/052019, mailed Jan. 18, 2006, pp. 1.

* cited by examiner

ADDRESSING STRATEGY FOR VITERBI METRIC COMPUTATION

FIELD OF THE INVENTION

The present invention relates to an addressing architecture for parallel processing of recursive data and to a mobile device comprising such an addressing architecture.

BACKGROUND OF THE INVENTION

In many wireless communications systems, convolutional coding is used to enable correction of errors in received symbols due to transmission distortions such as noise. A commonly used process for decoding convolutionally encoded symbols is the Viterbi decoding process. Errors in the received symbols may be corrected since redundancy is added to the transmitted, convolutional by encoded symbols. This is referred to as channel coding. Error correction is influenced by a number of parameters, one being the number of past samples that is used to form the current sample. This is referred to as the constraint length k, and equals the number of unit delay elements included in the encoder plus one. The constraint length represents the total span of past samples used to form the current sample. The number of states of a convolutional coder is determined by the number of unit delay elements. In practice, a coder having a constraint length k is implemented by means of a (k−1)-stage shift register where selected outputs are added to form the encoded symbols. Consequently, the number of possible states is $2^{k-1}$. Hence, a three-bit shift register can produce eight different states (and has a constraint length k of four). Another important parameter is the coding rate R, which is defined as the ratio of input bits to output bits of the coder. Hence, for a coding rate of 1/3, three output bits are transmitted for each input bit, i.e. each input bit forms an output symbol that comprises three bits.

Allowable state transitions of the coder are represented by a trellis diagram. The states represent the actual bit content in the shift register and the state transitions represent the output symbols associated with a certain input. The state transitions also define the path of the trellis. Viterbi decoding starts only after a certain number of encoded symbol has been received, whereby the coder has undergone a number of state transitions and a corresponding number of trellis paths have been created. The Viterbi decoding process provides a method for finding the most probable path through the trellis of state transitions while minimizing the number of trellis paths. This is done by calculating the most likely previous state for all coder states. The most likely previous state is estimated by combining the current input value and the accumulated path metrics of the previous states. Since each state has two or more possible input paths, an accumulated distance is calculated for each input path. The path with the minimum accumulated distance is selected as the most likely path. This minimum path is traced back to its beginning, and the traced-back symbol sequence becomes the decoded signal. Some convolution coders (coders having a coding rate of 1/n) have the advantage that their trellis diagrams can be divided into small groups, so called butterflies. By exploiting butterfly symmetry in the trellis diagram, the number of path metric calculations can be reduced. The butterfly arrangement has the advantage that prior accumulated metrics (i.e. old metric values) are the same for the updates of both new states, which minimizes address manipulations.

In the prior art Viterbi decoding process, metric update is typically performed by using four buffers for each butterfly, two input (read) buffers and two output (write) buffers. The read buffers comprise the old accumulated metrics and the write buffers comprise the new metrics. The total size of the buffers is $2^{k-1}$ words, is equal to the number of delay states. Hence, the size of each buffer is $2^{k-1}/4$.

Reading/writing is made from/to these different buffers, and for each state transition the read buffers are updated. A problem associated with this approach is that each new path metric must be stored at the correct memory location because the path metrics are linked, or associated, to each other with pointers. The old metrics are accessed in consecutive order, i.e. the order of the metrics are important for the decoding process, and pointers are employed to maintain the order of the metrics.

FIG. 1 shows a prior art addressing architecture for a Viterbi decoding process where metric update is typically performed by using four buffers 101, 102, 103, 104 (and 111, 112, 113, 114) for each butterfly 115 (and 125). These four buffers comprises two input (read) buffers 103, 104 and two output (write) buffers 101, 102. The read buffers comprise the old accumulated metrics and the write buffers comprise the new metrics. As mentioned previously, when using this addressing approach, new path metric must be stored at the correct memory location because the path metrics are associated to each other with pointers. The old metrics are accessed in consecutive order, and pointers are employed to maintain the order of the metrics.

SUMMARY OF THE INVENTION

An object of the present invention is to solve the problem given above and hence to provide an addressing architecture for a decoder that utilizes a smaller storage area for the corresponding path metric computations.

This object is achieved by an addressing architecture for parallel processing of recursive data in accordance with claim 1.

According to a first aspect of the invention, an addressing architecture is provided, which architecture comprises memory means arranged with a first storage area for storing a first set of path metrics and a second storing area for storage a second set of path metrics, which first storage area is coupled to a first memory input and a first memory output, and which second storage area is coupled to a second memory input and a second memory output. The architecture further comprises selector means arranged to connect the first memory output or the second memory output to a first selector output, and the first memory output or the second memory output to a second selector output. Moreover, the architecture comprises a Viterbi butterfly structure having a first set of inputs connected to the first selector output, a second set of inputs connected to the second selector output, a first set of outputs connected to the first memory input and a second set of outputs connected to the second memory input. The selector means may be manipulated to control the Viterbi butterfly structure such that new path metrics are stored in desired respective storage areas.

A basic idea of the present invention is to store a calculated new path metric in the memory position used by the old path metric, which old metric was employed to calculate the new metric. If m metric values are read and m metric values are simultaneously calculated in parallel, it is possible to store the new, calculated metrics in the memory position where the old metrics were held. In this case, it is not always possible to allocate each metric value at the same location of the same memory, as metric values may be erased.

The new addressing strategy is based on the idea that two double port memories are used independently of the number nb of butterflies, if this number nb is a power of two. The number of data positions in each memory is $2^{(k-2)}/nb$, and the size of each data position is nb×(the number of bits for each path metric). This permits the decoder to calculate 2×nb values in parallel. At each location of the memories, nb path consecutive metrics will be stored. Hence, if nb=8, the metrics will be stored as 0-7, 8-15, 16-23, etc. Adding two multiplexers enable the butterflies to always write to the same memory. The multiplexers are managed by respective parity bits based on the bit content of the corresponding address.

The present invention is advantageous, since the size of the storage area for the path metrics is reduced to half compared to the storage area employed in prior art Viterbi decoders for the same performance with regard to path metric computations.

This advantage is important for the mobile device the dimension of which becomes smaller and smaller.

Further features of and advantages with the present invention will become apparent when studying the appended claims and the following description. Those skilled in the art realize that different features of the present invention can be combined to create embodiments other than those described in the following.

BRIEF DESCRIPTION OF THE DRAWINGS

The present invention will be described in detail with reference made to the accompanying drawings, in which:

FIG. 2 shows an addressing architecture in accordance with the present invention. In this exemplifying embodiment, the architecture comprises four butterflies 212, 222, 232, 242. First, before starting the decoding process, the decoder must be initialized. A first memory 211 stores the new path metrics that return a value of 0 and a second memory 221 stores the new path metrics that return a value of 1. Note that these two memories are not necessarily located in two different memory chips, but could be implemented as two storage areas located in the same memory chip with two sets of address and data inputs (and data outputs).

Figure 1:
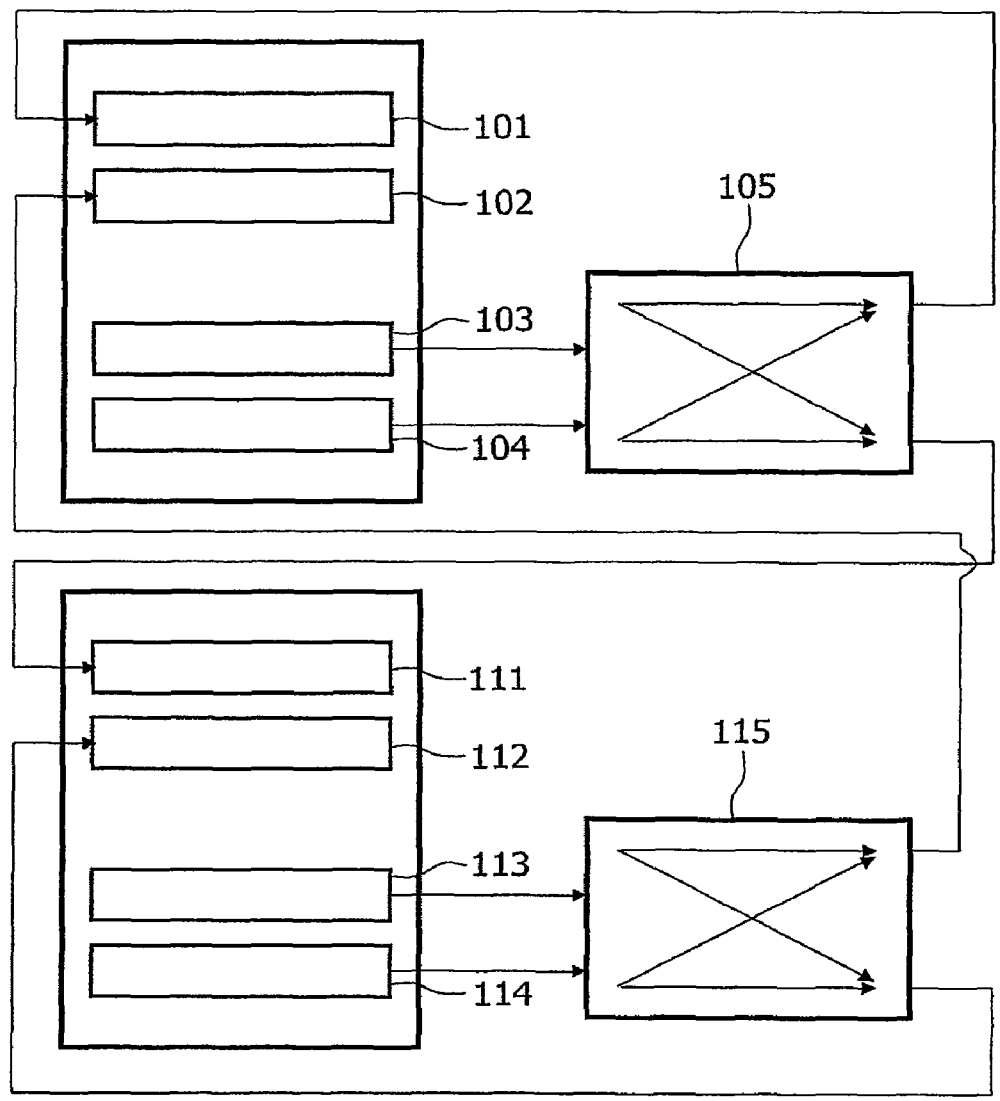
FIG. 1 shows a prior art addressing architecture for a Viterbi decoder.
Figure 2:
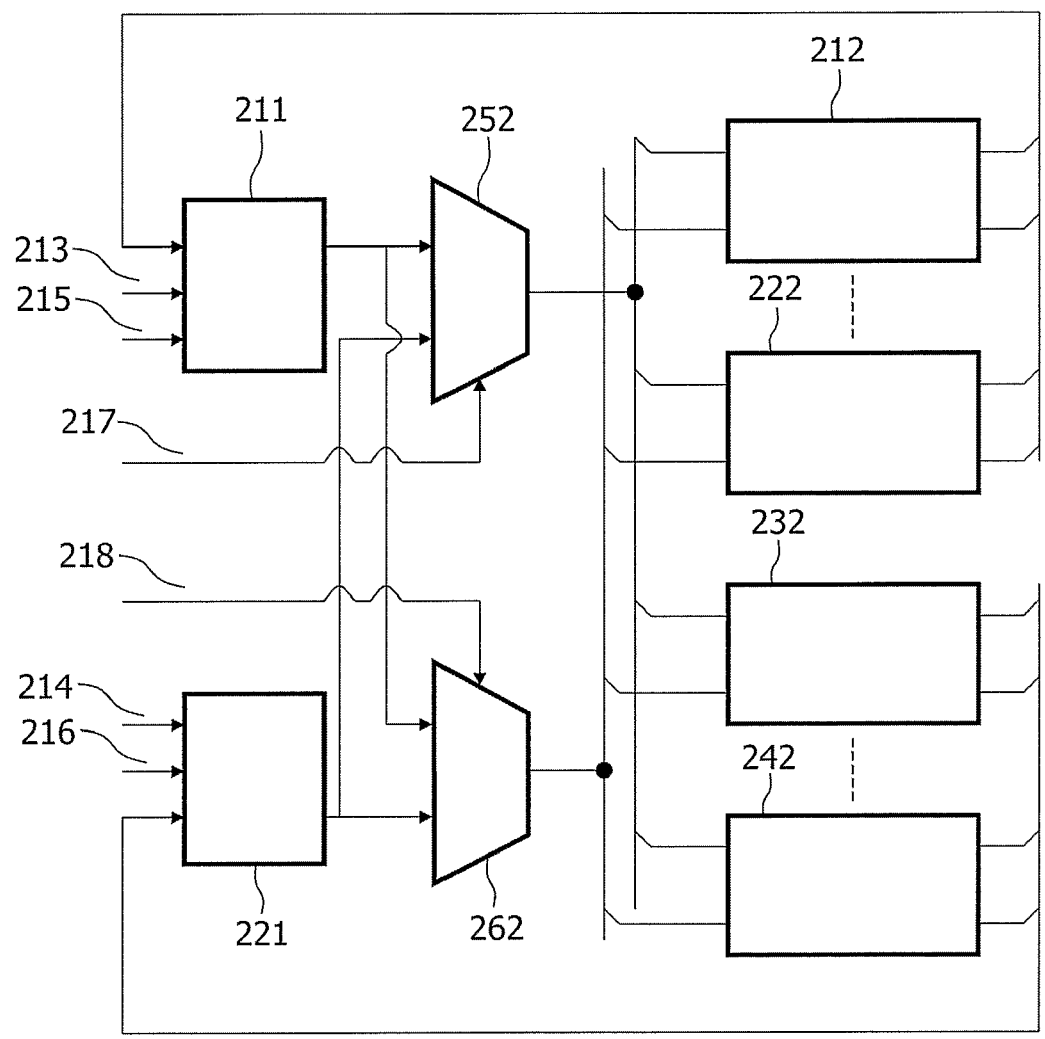
FIG. 2 shows an addressing architecture in accordance with the present invention.

The values employed to initialize the decoder, i.e. the values that are initially stored in the memories 211, 221 are:

$$ns/nb \text{ if } ns<2^{(k-2)}; \text{ and}$$

$$(ns-2^{(k-2)})/nb \text{ if } ns\geq 2^{(k-2)}.$$

where ns denotes the total number of possible states of the decoder. Each memory 211, 221 comprises two address inputs respectively: one read address input 213, 214, and one write address input 215, 216. The write address for each calculated metric is always the same as the read address that was set to read the data employed in the calculation of the metric. For example, if the old metric values i and $i+2^{(k-2)}$ are read from location x of the first memory 111 and location y of the second memory 221, respectively, the calculated new metrics 2i and 2i+1 will be stored in the corresponding location x and y. The two selectors, or multiplexers 252, 262, enable the butterflies to always write to the same memory. The multiplexers are controlled by respective address parity bits 217, 218. The parity bit is set to 1 if the total number of 1's in the corresponding address is odd, and to 0 if the total number of 1's in the corresponding address is an even number. The multiplexers may also be implemented in the same physical chip. In that case, the chip would (at least) have four data inputs, two data outputs and two control inputs to function equivalently to the multiplexers 252, 262.

Figure 3:
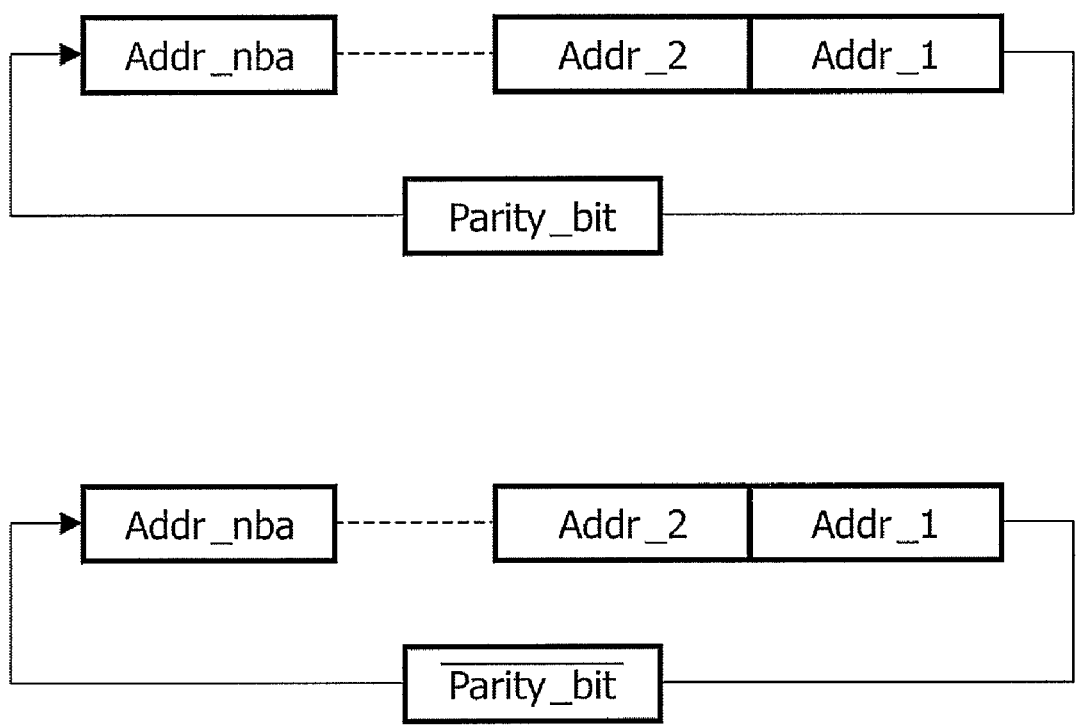
FIG. 3 shows the shifting of address bits in the two memories for each state transition.

After the initialization, the values stored in the memories will undergo a right-shift at each state transition of the decoder, as shown in FIG. 3. The upper portion of FIG. 3 represents the first memory 211 and the lower portion represents the second memory 221. The actual memory address for each value is calculated from the previous address, where the number of bits per address, nba, equals $\log_2(2^{(k-2)}/nb)$. For the first memory 211, the parity bit of the previous address is introduced from the left and shifts the previous address to the right, so the current address is formed by the bits Parity_bit, Addr_nba, . . . , Addr_2, Addr_1. For the second memory 221, the inverse of the parity bit 218 of the previous address is introduced from the left and shifts the previous address to the right, so the current address is formed by the bits inv (Parity_bit), Addr_nba, . . . , Addr_2, Addr_1.

Table 1 exemplifies the addressing procedure for the first memory, and Table 2 exemplifies the addressing procedure for the second memory.

TABLE 1

Addressing procedure for the first memory.
Memory First

| Address | State 0 | State 1 | State 2 | State 3 | State 4 |
|---|---|---|---|---|---|
| 0 | 0-7 | 0-7 | 0-7 | 0-7 | 0-7 |
| 1 | 136-143 | 24-31 | 48-55 | 96-103 | 192-199 |
| 2 | 144-151 | 40-47 | 80-87 | 160-167 | 72-79 |
| 3 | 24-31 | 48-55 | 96-103 | 192-199 | 136-143 |
| 4 | 160-167 | 72-79 | 144-151 | 40-47 | 80-87 |
| 5 | 40-47 | 80-87 | 160-167 | 72-79 | 144-151 |
| 6 | 48-55 | 96-103 | 192-199 | 136-143 | 24-31 |
| 7 | 184-191 | 120-127 | 240-247 | 232-239 | 216-223 |
| 8 | 192-199 | 136-143 | 24-31 | 48-55 | 96-103 |
| 9 | 72-79 | 144-151 | 40-47 | 80-87 | 160-167 |
| 10 | 80-87 | 160-167 | 72-79 | 144-151 | 40-47 |
| 11 | 216-223 | 184-191 | 120-127 | 240-247 | 232-239 |

TABLE 1-continued

Addressing procedure for the first memory.
Memory First

| Address | State 0 | State 1 | State 2 | State 3 | State 4 |
|---------|---------|---------|---------|---------|---------|
| 12 | 96-103 | 192-199 | 136-143 | 24-31 | 48-55 |
| 13 | 232-239 | 216-223 | 184-191 | 120-127 | 240-247 |
| 14 | 240-247 | 232-239 | 216-223 | 184-191 | 120-127 |
| 15 | 120-127 | 240-247 | 232-239 | 216-223 | 184-191 |

For example, if a value has been read from address 7 (0111), it is going to be read from address 11 (1011) in the next state with regard to the first memory (see Table 1).

TABLE 2

Addressing procedure for the second memory.
Second memory

| Address | State 0 | State 1 | State 2 | State 3 | State 4 |
|---------|---------|---------|---------|---------|---------|
| 0 | 128-135 | 8-15 | 16-23 | 32-39 | 64-71 |
| 1 | 8-15 | 16-23 | 32-39 | 64-71 | 128-135 |
| 2 | 16-23 | 32-39 | 64-71 | 128-135 | 8-15 |
| 3 | 152-159 | 56-63 | 112-119 | 224-231 | 200-207 |
| 4 | 32-39 | 64-71 | 128-135 | 8-15 | 16-23 |
| 5 | 168-175 | 88-95 | 176-183 | 104-111 | 208-215 |
| 6 | 176-183 | 104-111 | 208-215 | 168-175 | 88-95 |
| 7 | 56-63 | 112-119 | 224-231 | 200-207 | 152-159 |
| 8 | 64-71 | 128-135 | 8-15 | 16-23 | 32-39 |
| 9 | 200-207 | 152-159 | 56-63 | 112-119 | 224-231 |
| 10 | 208-215 | 168-175 | 88-95 | 176-183 | 104-111 |
| 11 | 88-95 | 176-183 | 104-111 | 208-215 | 168-175 |
| 12 | 224-231 | 200-207 | 152-159 | 56-63 | 112-119 |
| 13 | 104-111 | 208-215 | 168-175 | 88-95 | 176-183 |
| 14 | 112-119 | 224-231 | 200-207 | 152-159 | 56-63 |
| 15 | 248-255 | 248-255 | 248-255 | 248-255 | 248-255 |

If a value has been read from address 7 (0111), it is going to be read from address 3 (0011) in the next state with regard to the second memory (see Table 2). By employing this addressing architecture, the read address for the memories is the same every $\log_2(2^{(k-2)}/nb)+1$ state.

Figure 4:
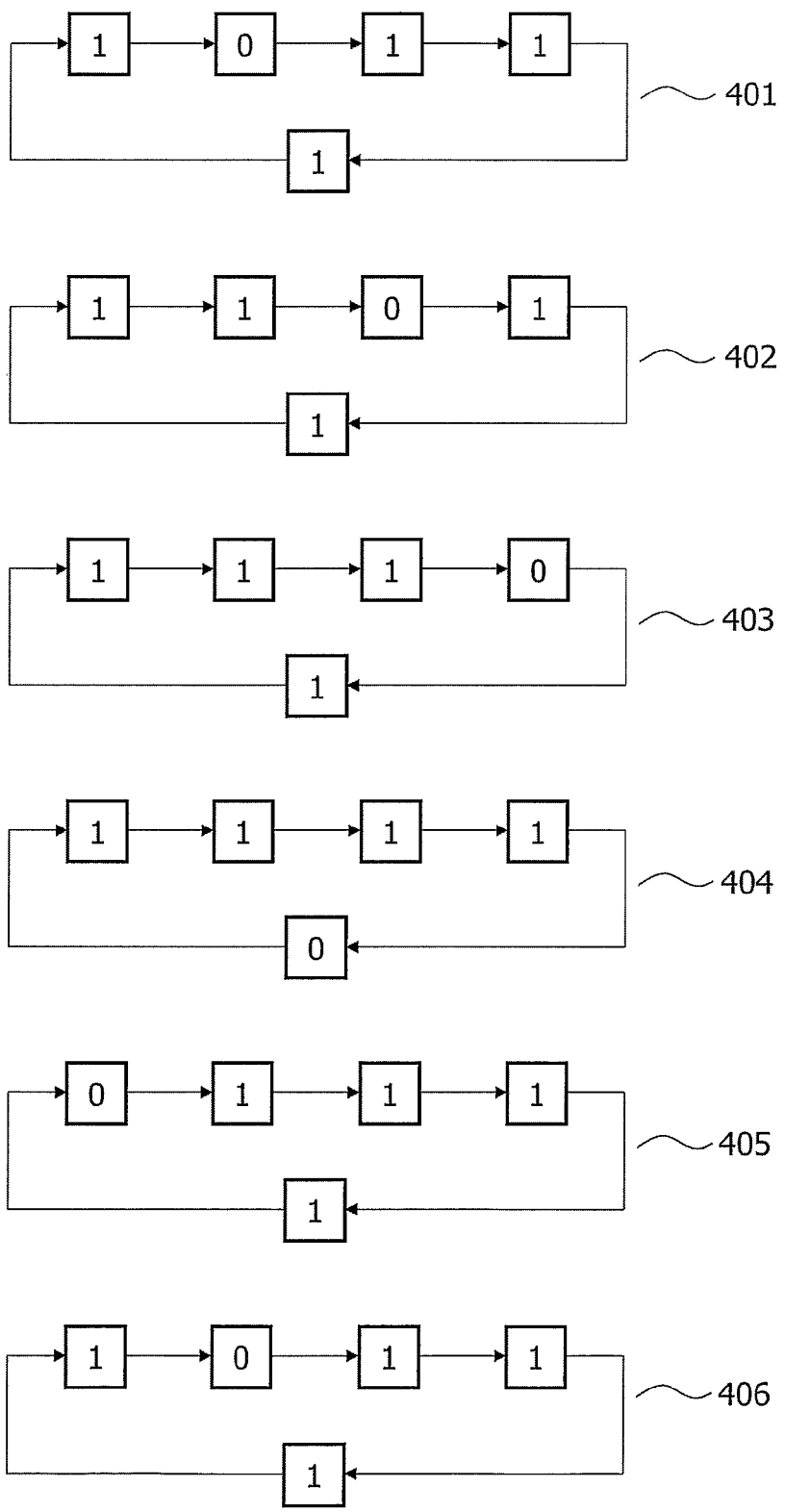
FIG. 4 shows an exemplifying addressing sequence for the first memory in the addressing architecture.

FIG. 4 illustrates the addressing sequence for the bold-typed states in Table 1. At 401, the first memory 211 is initialized with 1011 (decimal 11). The parity bit is 1, since 1011 contains an odd number of 1's. Then, at 402, at a state transition, the register is shifted and the new memory address is hence 1101 (decimal 13) with parity bit 1. At 403, the third memory address is 1110 (decimal 14) and the parity bit is 1. At 404, in State 3, the address becomes 1111 (decimal 15) and the parity bit changes to 0 since 1111 contains an even number of 1's. At the final state, the address is 0111 (decimal 7) and the parity bit is 1. Thereafter, the initial state is entered again, resulting in memory address 1011 (decimal 11) and a parity bit of 1.

Figure 5:
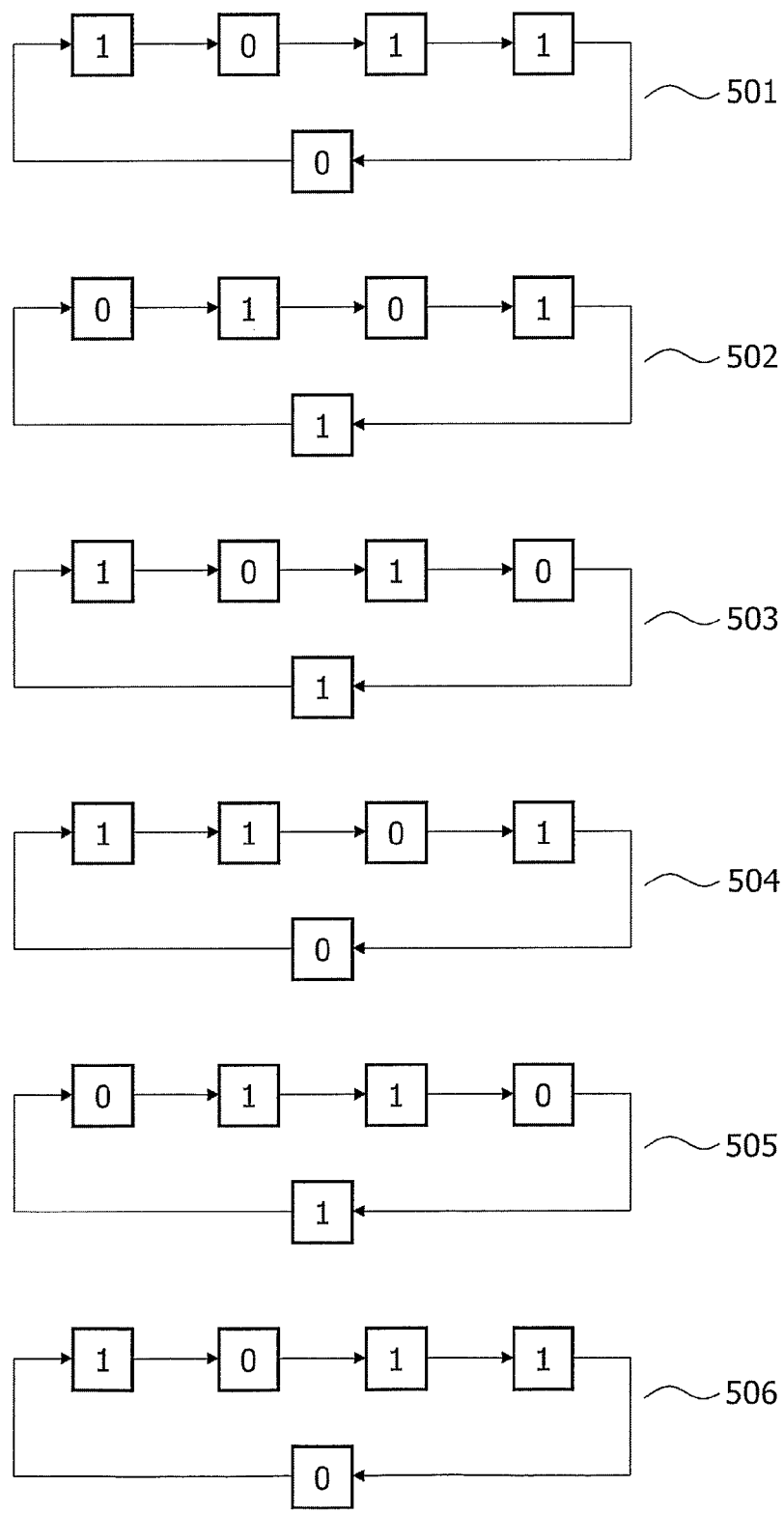
FIG. 5 shows an exemplifying addressing sequence for the second memory in the addressing architecture.

FIG. 5 illustrates the addressing sequence for the bold-typed states in Table 2. At 501, the second memory 221 is initialized with 1011 (decimal 11), just as in the previous example with the first memory 211, and the parity bit is hence 1. Then, at 502, at a state transition, the register is shifted and the new memory address is hence 0101 (decimal 5) with parity bit 0. At 503, the third memory address is 1010 (decimal 10) and the parity bit is 0. At 504, in State 3, the address becomes 1101 (decimal 13) and the parity bit changes to 1. At the final state, the address is 0110 (decimal 6) and the parity bit is 0. Thereafter, the initial state is entered again, resulting in memory address 1011 (decimal 11) and a parity bit of 1.

Hence, with the addressing architecture of the present invention, the size of the storage area is reduced to half compared to the storage area employed in prior art Viterbi decoders for the same performance with regard to path metric computations.

Note that the computations and calculations performed in the present addressing architecture typically are performed by a microprocessor (CPU), a digital signal processor (DSP), an application specific integrated circuit (ASIC) or some other appropriate device having computing capabilities.

The invention find important applications in the mobile device field.

Even though the invention has been described with reference to specific exemplifying embodiments thereof, many different alterations, modifications and the like will become apparent to those skilled in the art. The embodiments described are therefore not intended to limit the scope of the invention, as defined by the appended claims.

The invention claimed is:

1. An addressing architecture for parallel processing of recursive data, which architecture comprises:
  memory arranged with a first storage area for storing a first set of path metrics and a second storage area for storing a second set of path metrics, which first storage area is coupled to a first memory input and a first memory output, and which second storage area is coupled to a second memory input and
a second memory output;
a selector arranged to connect the first memory output or the second memory output to a first selector output, and the first memory output or the second memory output to a second selector output; and
a Viterbi butterfly structure having a first set of inputs connected to the first selector output, a second set of inputs connected to the second selector output, a first set of outputs connected to the first memory input and a second set of outputs connected to the second memory input,
wherein the selector is configured to control the Viterbi butterfly structure such that new path metrics are stored in desired respective storage areas.

2. The addressing architecture according to claim 1, wherein the selector is arranged with a control input via which the selector is configured to control the Viterbi butterfly structure such that new path metrics are stored in the desired respective storage areas.

3. The addressing architecture according to claim 1, wherein the storage areas of the memory further comprise respective read enable inputs that are separated from each other and respective write enable inputs that are separated from each other.

4. The addressing architecture according to claim 3, wherein a memory write address for a new path metric is set to be equal to a corresponding memory read address for an old path metric that was employed to compute said new path metric.

5. The addressing architecture according to claim 2, wherein the selector is manipulated by applying, via said control input, parity bits based on a current memory address.

6. The addressing architecture according to claim 5, wherein the connection of the first or second memory output to the first selector output is controlled by a first parity bit based on a current memory address of the first storage area, and the connection of the first or second memory output to the second selector output is controlled by a second parity bit based on a current memory address of the second storage area.

7. The addressing architecture according to claim 6, wherein the current address for the first storage area is calculated by performing a right-shift of the previous address of the first storage area and adding the parity bit of the previous address of the first storage area as the most significant bit, and the current address for the second storage area is calculated by performing a right-shift of the previous address of the second storage area and adding an inverted parity bit of the previous address of the second storage area as the most significant bit.

8. The addressing architecture according to claim 5, wherein the parity bit is set to 1 if the total number of 1's in the corresponding current memory address is odd, and to 0 if the total number of 1's in the corresponding current memory address is even.

9. The addressing architecture according to claim 1, wherein said two storage areas are used regardless of the number of butterflies used in the Viterbi butterfly structure.

10. The addressing architecture according to claim 1, wherein said memory arranged with a first storage area for storing a first set of path metrics and a second storage area for storing a second set of path metrics comprises of two separate double-port memories storing a respective set of path metrics.

11. A mobile device comprising an addressing architecture according to claim 1.

* * * * *